US012691481B2

(12) United States Patent
Ando et al.

(10) Patent No.: US 12,691,481 B2
(45) Date of Patent: Jul. 28, 2026

(54) SUBSTRATE PROCESSING APPARATUS AND SUBSTRATE PROCESSING SYSTEM

(71) Applicant: SCREEN Holdings Co., Ltd., Kyoto (JP)

(72) Inventors: Koji Ando, Kyoto (JP); Tomohiro Motono, Kyoto (JP); Noritake Sumi, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 156 days.

(21) Appl. No.: 18/425,969

(22) Filed: Jan. 29, 2024

(65) Prior Publication Data

US 2024/0253093 A1     Aug. 1, 2024

(30) Foreign Application Priority Data

Jan. 30, 2023    (JP) ................................. 2023-011754

(51) Int. Cl.
*H10P 72/00* (2026.01)
*B08B 7/00* (2006.01)
*B08B 15/02* (2006.01)

(52) U.S. Cl.
CPC ............ *B08B 15/02* (2013.01); *B08B 7/0021* (2013.01); *B08B 2215/003* (2013.01); *H10P 72/0408* (2026.01)

(58) Field of Classification Search
CPC . B08B 7/0021; B08B 15/02; B08B 2215/003; H01L 21/02101;
(Continued)

(56) References Cited

U.S. PATENT DOCUMENTS 5,876,280 A     3/1999 Kitano et al. ................. 454/187
2003/0050005 A1     3/2003 Nakao
(Continued)

FOREIGN PATENT DOCUMENTS

JP     2003-081406 A     3/2003
JP     2004-200574 A     7/2004
(Continued)

OTHER PUBLICATIONS

Office Action dated Sep. 18, 2024 for the corresponding Taiwanese Patent Application No. 112151258.
(Continued)

*Primary Examiner* — David G Cormier
(74) *Attorney, Agent, or Firm* — OSTROLENK FABER LLP

(57) ABSTRACT

A substrate processing apparatus and a substrate processing system according to the invention includes a processing chamber having a processing space capable of accommodating a substrate inside, being provided with an aperture on a side surface thereof, which communicates with the processing space to cause the substrate to pass therethrough, and being disposed under a downflow environment, a lid part which closes and opens the aperture, a fluid supplier which supplies a heated processing fluid to be used for processing the substrate to the processing space closed by the lid part, and a regulator which guides at least part of an air flowing as the downflow to around the processing chamber and generates an airflow having a uniform flow velocity along an outer surface of the processing chamber.

8 Claims, 5 Drawing Sheets

(58) Field of Classification Search
CPC ......... H01L 21/67017; H01L 21/67023; H01L
21/67028; H01L 21/67034; H01L
21/6704; H01L 21/67155; H01L 21/6719;
H01L 21/67248; H01L 21/67253; H10P
70/80; H10P 72/0402; H10P 72/0404;
H10P 72/0406; H10P 72/0408; H10P
72/0411; H10P 72/0451; H10P 72/0462;
H10P 72/0602; H10P 72/0604
See application file for complete search history.

(56) References Cited

U.S. PATENT DOCUMENTS

| | | | |
|---|---|---|---|
| 2006/0102210 A1 | 5/2006 | Chouno et al. .............. 134/148 | |
| 2020/0234998 A1 | 7/2020 | Kosugi et al. | |
| 2021/0242058 A1* | 8/2021 | Sumi ................ H01L 21/67772 | |
| 2024/0142171 A1* | 5/2024 | Oh ........................... F26B 5/08 | |

FOREIGN PATENT DOCUMENTS

| | | | |
|---|---|---|---|
| JP | 2007-053167 A | 3/2007 |
| JP | 2007-220773 A | 8/2007 |
| JP | 2009-012927 A | 1/2009 |
| JP | 2021-125472 A | 8/2021 |
| KR | 10-2020-0132827 A | 11/2020 |
| KR | 10-2021-0098349 A | 8/2021 |
| TW | 333658 B | 6/1998 |
| TW | 202040668 A | 11/2020 |
| TW | 202215590 A | 4/2022 |

OTHER PUBLICATIONS

Notice of Allowance issued on Jan. 20, 2025 for the corresponding Korean Patent Application No. 10-2024-0012104 with English translation attached.

* cited by examiner

F I G. 1
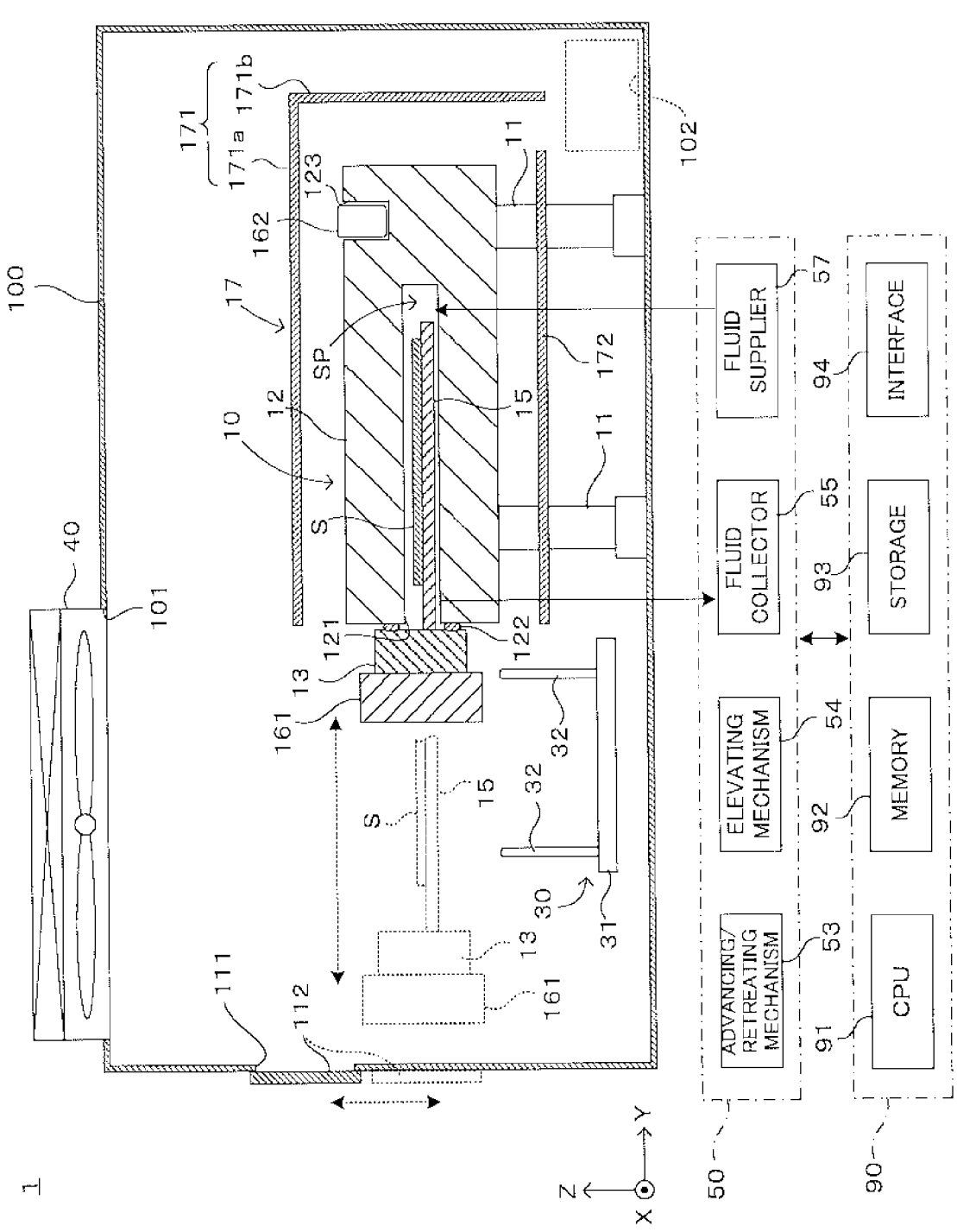

F I G. 2
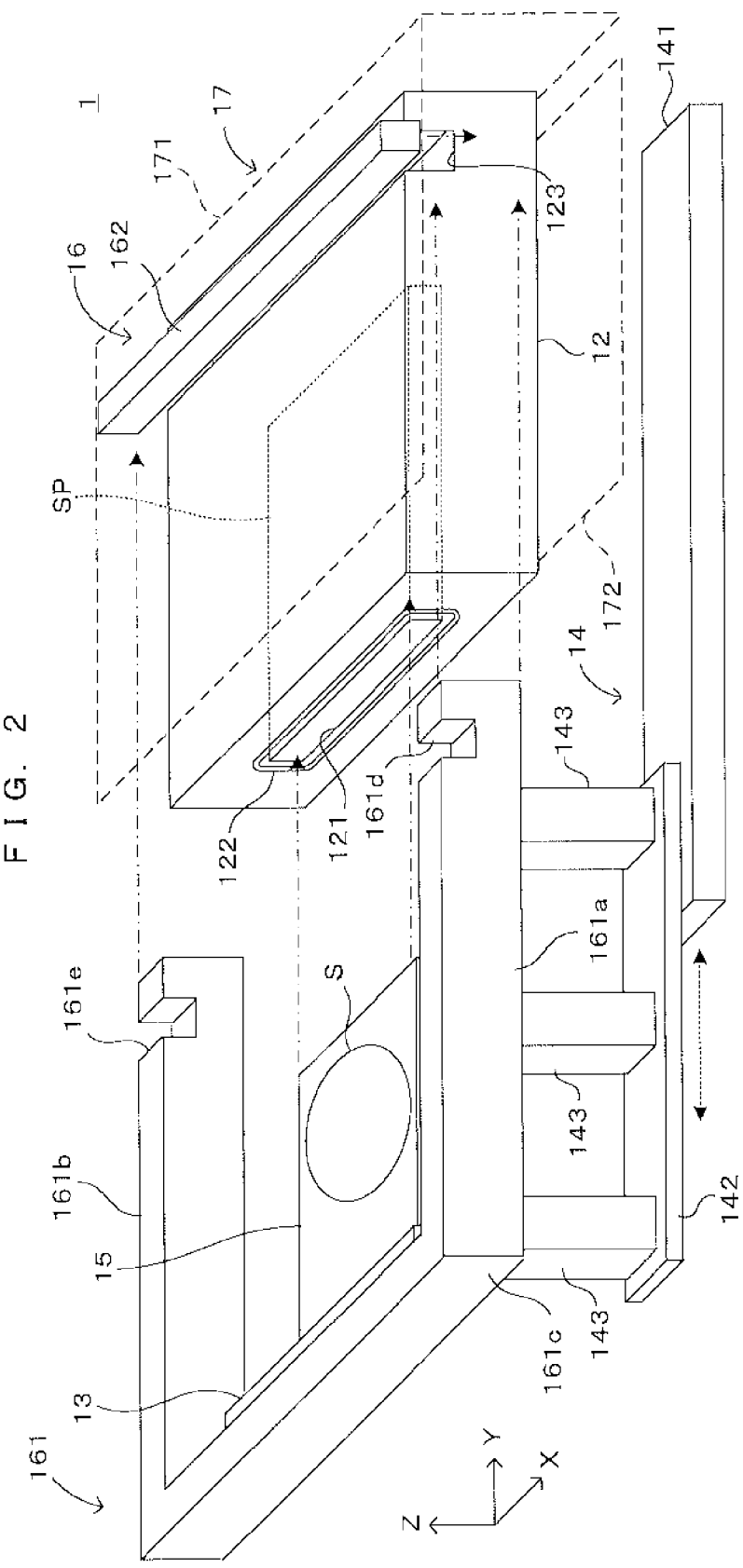

F I G. 4
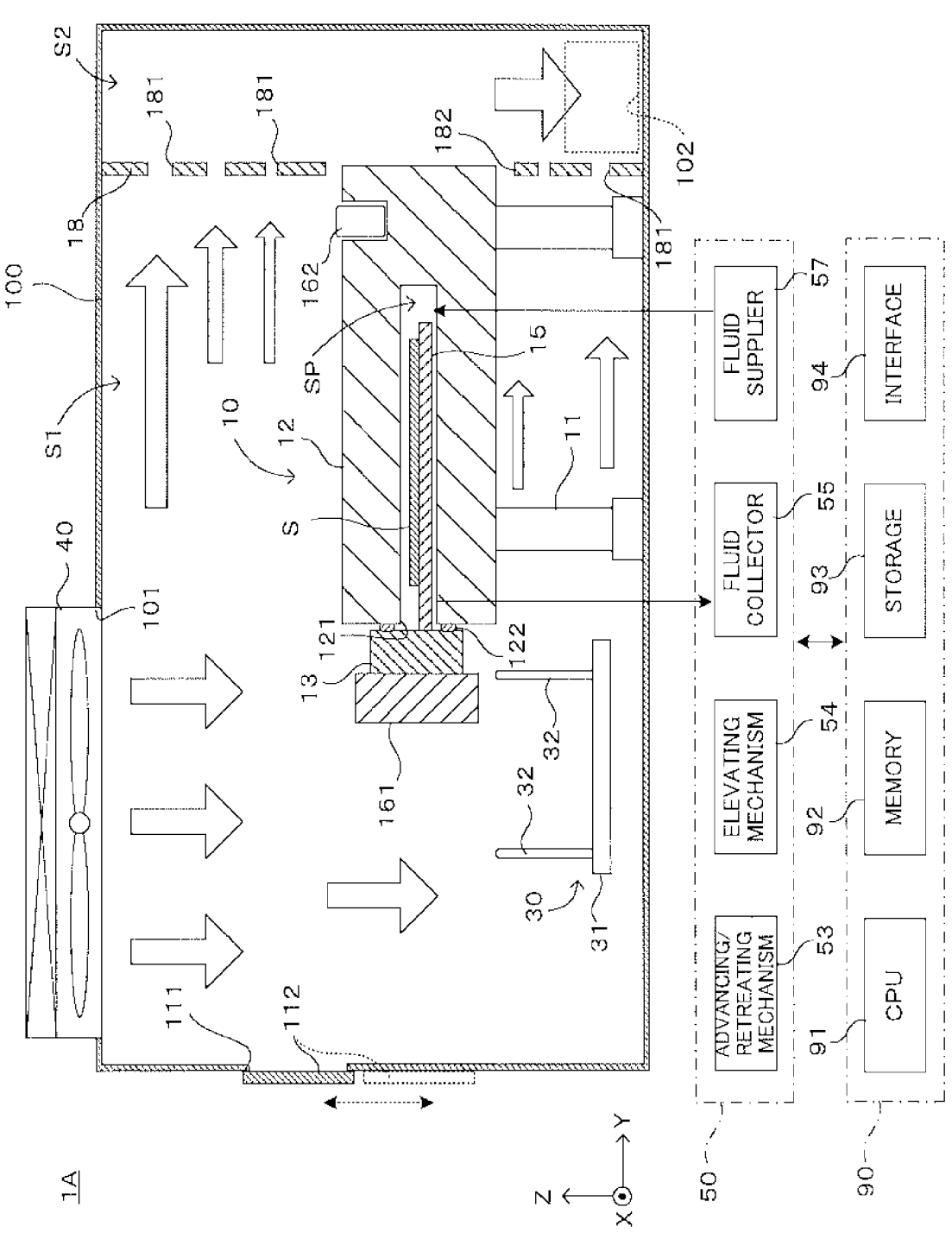

F I G. 5 A
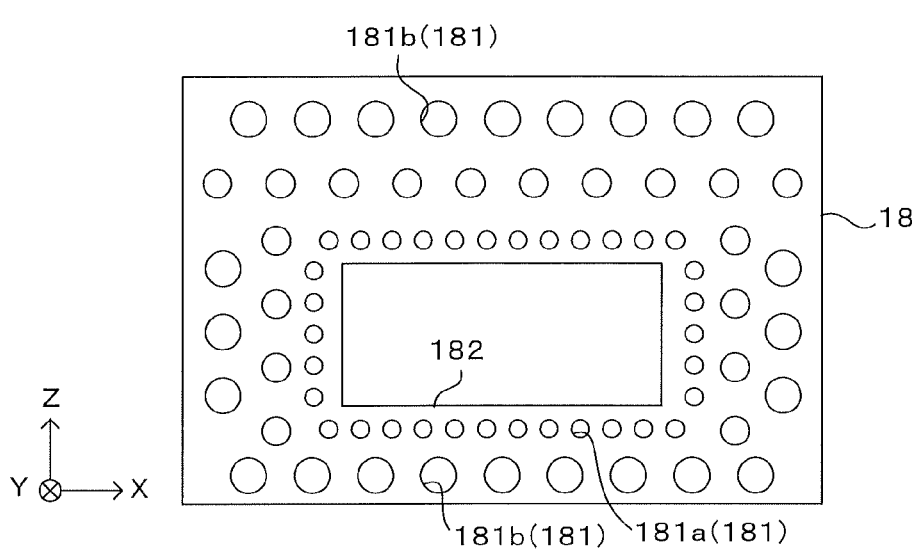
F I G. 5 B
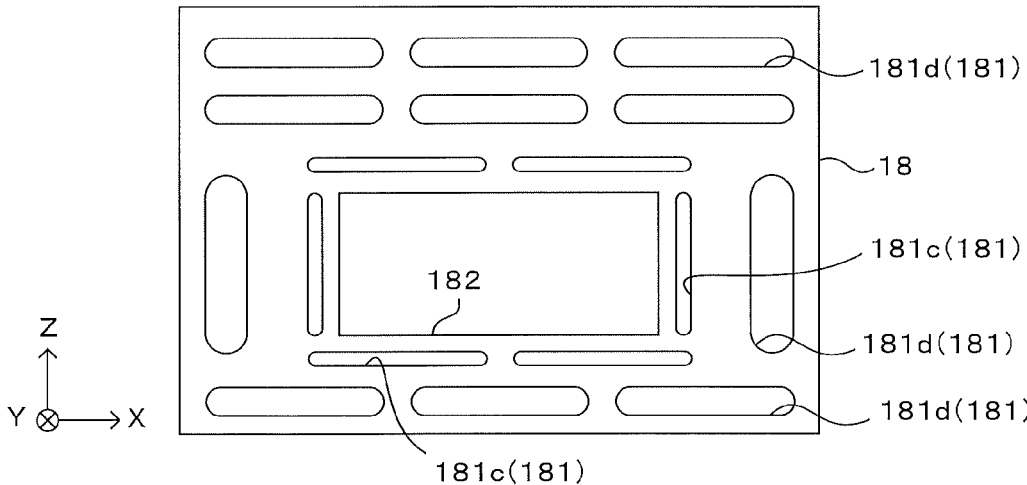

SUBSTRATE PROCESSING APPARATUS AND SUBSTRATE PROCESSING SYSTEM

CROSS REFERENCE TO RELATED APPLICATION

The disclosure of Japanese Patent Application No. 2023-011754 filed on Jan. 30, 2023 including specification, drawings and claims is incorporated herein by reference in its entirety.

BACKGROUND OF THE INVENTION

1. Field of the Invention

This invention relates to a substrate processing apparatus for processing a substrate inside a processing chamber, and more particularly to a substrate processing apparatus and a substrate processing system for introducing a heated processing fluid into the processing chamber to perform processing.

2. Description of the Related Art

The process of processing various substrates such as a semiconductor substrate, a glass substrate for a display apparatus, and the like includes processing of a substrate with various processing fluids. In some cases, such processing is performed in a processing space inside an airtight processing chamber for the purpose of efficiently using the processing fluid and preventing dissipation of the processing fluid to the outside. In this case, since the processing space is isolated from an external space, it is thought that basically no effect of outer atmosphere is produced on the processing. However, it is more preferable that the processing chamber should be accommodated in, for example, a processing room capable of realizing a downflow environment in order to prevent some contaminants from mixing in when a substrate is loaded or unloaded into/from the processing space or, for example, in preparation for a case where a toxic substance is leaked out.

For example, JP2021-125472A (PTL 1), which the present applicant precedently disclosed, discloses a case where a high-pressure chamber for supercritical process is disposed inside a processing room provided with a fan filter unit (FFU) for generating a downflow of clean air. In this prior art, the FFU is provided above a region in an internal space of the processing room, where a substrate is passed from a conveyor robot to the high-pressure chamber. It is thereby possible to keep the clearest atmosphere in a space where the substrate is passed and effectively prevent contaminants from mixing in.

As described above, in a processing system in which a downflow is formed around a processing chamber, there is a possibility that an airflow caused by the downflow may affect a temperature of the processing chamber. Particularly, in a process using a heated processing fluid, a temperature decrease is easy to occur on a surface of the processing chamber with which the downflow directly comes into contact, and a temperature irregularity in the entire processing chamber due to the this sometimes affects a processing quality. As a temperature of the processing fluid increases, the affection becomes more remarkable.

For this reason, a measure to appropriately perform atmosphere control around the processing chamber by the downflow and suppress the temperature irregularity from occurring when the processing chamber is thereby locally cooled is required. No consideration is made on this in the above-described background art and there remains a room for improvement in that regard.

SUMMARY OF THE INVENTION

This invention is intended to solve the above-described problem, and it aims to provide a technique for suppressing a temperature irregularity in a processing chamber caused by a downflow in a substrate processing apparatus and a substrate processing system for processing a substrate by supplying a processing fluid into the processing chamber under a downflow environment.

One aspect of this invention is intended for a substrate processing apparatus, and the substrate processing apparatus includes a processing chamber having a processing space capable of accommodating a substrate inside, being provided with an aperture on a side surface thereof, which communicates with the processing space to cause the substrate to pass therethrough, and being disposed under a downflow environment, a lid part capable of closing the aperture, a fluid supplier for supplying a heated processing fluid to be used for processing the substrate to the processing space closed by the lid part, and a regulator for guiding at least part of an air flowing as the downflow to around the processing chamber and generates an airflow having a uniform flow velocity along an outer surface of the processing chamber.

Further, another aspect of this invention is intended for a substrate processing apparatus provided in a processing room where an airflow generation apparatus for generating a downflow is provided, and the substrate processing apparatus includes a processing chamber having a processing space capable of accommodating a substrate inside and being provided with an aperture on a side surface thereof, which communicates with the processing space to cause the substrate to pass therethrough, a lid part capable of closing the aperture, a fluid supplier for supplying a heated processing fluid to be used for processing the substrate to the processing space closed by the lid part, and a regulator for guiding at least part of an air flowing as the downflow to around the processing chamber and generates an airflow having a uniform flow velocity along an outer surface of the processing chamber.

Furthermore, still another aspect of this invention is intended for a substrate processing system, and the substrate processing system includes a processing chamber having a processing space capable of accommodating a substrate inside and being provided with an aperture on a side surface thereof, which communicates with the processing space to cause the substrate to pass therethrough, a lid part capable of closing the aperture, a fluid supplier for supplying a heated processing fluid to be used for processing the substrate to the processing space closed by the lid part, a processing room accommodating the processing chamber and the lid part integrally in an internal space thereof, an airflow generator for generating a downflow in the internal space from an inlet port provided above the processing chamber among wall surfaces of the processing room, an exhaust port provided below the processing chamber among the wall surfaces of the processing room, for exhausting the internal space, and a regulator for guiding at least part of an air flowing as the downflow to around the processing chamber and generates an airflow having a uniform flow velocity along an outer surface of the processing chamber.

In the invention having the above-described configuration, since the regulator is provided, an airflow having a uniform flow velocity is generated around the processing chamber along an outer surface thereof. The causes for occurrence of the temperature irregularity in the processing chamber are direct and local contact of the airflow having a high flow velocity caused by the downflow with the processing chamber, dependence of the flow velocity of the airflow during passing through around the processing chamber on an apparatus layout, and the like. Therefore, by generating an airflow around the processing chamber in a direction along the outer surface thereof and uniformizing the flow velocity, it is possible to suppress the temperature irregularity from occurring.

By simply blocking the downflow, the atmosphere control around the processing chamber cannot be appropriately performed. In the present invention, since at least part of the downflow is guided to around the processing chamber to thereby generate an airflow. It is possible to appropriately control the atmosphere also around the processing chamber.

As described above, in the present invention, part of the downflow is guided to around the processing chamber to thereby generate an airflow along the outer surface of the processing chamber and the flow velocity of the airflow is uniformized around the processing chamber. It is possible to suppress the temperature irregularity from occurring when the processing chamber is locally cooled while appropriately controlling the atmosphere around the processing chamber.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 1 is a view showing a schematic configuration of a first embodiment of a substrate processing system according to the present invention;

FIG. 2 is an external perspective view showing a principal part of this substrate processing system;

FIG. 4 is a view showing a schematic configuration of a second embodiment of the substrate processing system according to the present invention; and FIGS. 5A and 5B are views showing an exemplary arrangement pattern of through holes in a barrier wall.

DETAILED DESCRIPTION OF THE PREFERRED EMBODIMENTS

Figure 3A:
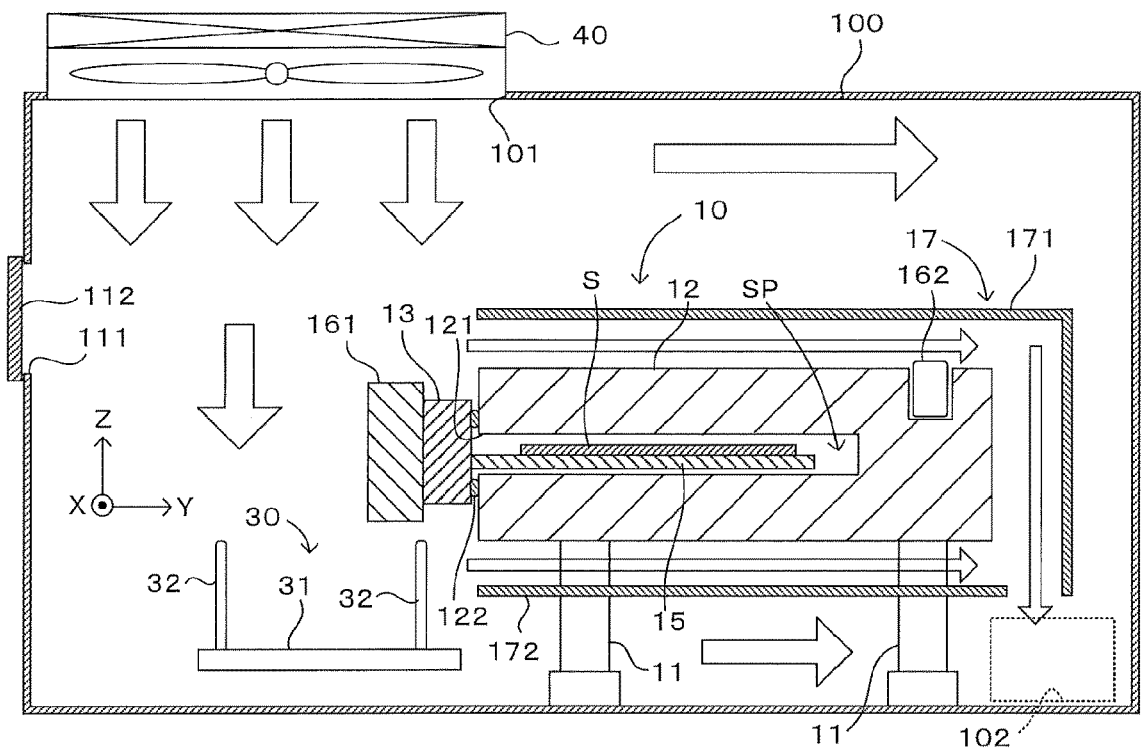
FIGS. 3A and 3B are views used for explaining an action of a regulator.

FIG. 1 is a view showing a schematic configuration of the first embodiment of a substrate processing system including a substrate processing apparatus according to the present invention. Further, FIG. 2 is an external perspective view showing a principal part of this substrate processing system. This substrate processing system 1 is a processing system for processing a surface of any one of various substrates such as a semiconductor substrate or the like by using a supercritical fluid. To show directions in each figure in a unified manner below, an XYZ orthogonal coordinate system is set as shown in FIG. 1. Here, an XY plane represents a horizontal plane. A Z direction represents a vertical direction, and more specifically, a (−Z) direction represents a vertically downward direction.

Various substrates such as semiconductor wafers, glass substrates for photomask, glass substrates for liquid crystal display, glass substrates for plasma display, substrates for FED (Field Emission Display), substrates for optical disk, substrates for magnetic disk, and substrates for magneto-optical disk can be adopted as the "substrate" in this embodiment. Though a substrate processing system used to process a disk-shaped semiconductor wafer will be mainly described below as an example with reference to the drawings, the substrate processing system can be adopted also to process various substrates illustrated above. Also as a shape of the substrate, various types are applicable.

The substrate processing system 1 includes a processing unit 10 and a transfer unit 30 both provided inside a clean room 100, and a supply unit 50 and a control unit 90 both provided inside or outside the clean room 100. Among wall surfaces constituting the clean room 100, in the vicinity of a (−Y) side end portion of a ceiling part (in the upper-left portion of FIG. 1), an inlet port 101 is provided and a fan filter unit (FFU) 40 is disposed therein. The fan filter unit (FFU) 40 supplies a clean downflow into the clean room 100 from above the processing unit 10.

Further, among the wall surfaces constituting the clean room 100, in a lower portion of a (+Y) side end portion of a (+X) side surface (in the lower-right portion of FIG. 1), provided is an exhaust port 102. The exhaust port 102 is connected to a not-shown gas exhaust facility outside the clean room 100. Therefore, clean air supplied as the downflow from above the clean room 100 through the inlet port 101 is discharged to the outside through the exhaust port 102 provided in the lower portion of the clean room 100. The inside of the clean room 100 is thereby kept at a clean atmosphere. At that time, from a positional relation between the inlet port 101 and the exhaust port 102, the air supplied from the inlet port 101 is guided to the exhaust port 102 through around a processing chamber 12 of the processing unit 10.

Furthermore, an aperture 111 is provided in a (−Y) side surface among the wall surfaces constituting the clean room 100. A shutter 112 which is openable/closable as indicated by a dotted arrow is attached to the aperture 111. In a state where the shutter 112 opens the aperture 111, loading and unloading of the substrate S can be performed through the aperture 111. In a state where the shutter 112 closes the aperture 111, the inside of the clean room 100 is cut off from an external space, and dust or the like in the outside is prevented from entering the clean room 100.

The processing unit 10 serves as an execution subject of a supercritical drying process. The transfer unit 30 receives an unprocessed substrate S transported by an external conveying device not shown in the figure, carries the substrate S into the processing unit 10, and delivers a processed substrate S from the processing unit 10 to the external conveying device. The supply unit 50 supplies chemical substances and power necessary for the process to the processing unit 10 and the transfer unit 30.

The control unit 90 realizes a predetermined process by controlling these components of the apparatus. For this purpose, the control unit 90 includes a CPU 91, a memory 92, a storage 93, an interface 94, and the like. The CPU 91 executes various control programs. The memory 92 temporarily stores processing data. The storage 93 stores the control programs to be executed by the CPU 91. The interface 94 exchanges information with a user and an external apparatus. Operations of the apparatus to be described later are realized by the CPU 91 causing each component of the apparatus to perform a predetermined operation by executing the control program written in the storage 93 in advance.

The processing unit 10 has a structure in which the processing chamber 12 is settled on supporting legs 11. The processing chamber 12 is structured by a combination of several metal blocks which form a hollow inside serving as a processing space SP. A substrate S to be processed is carried into the processing space SP to be processed. A slit-like aperture 121 elongated in an X direction is formed in a (−Y) side surface of the processing chamber 12, and the processing space SP communicates with the external space via the aperture 121.

A lid member 13 is provided on the (−Y) side surface of the processing chamber 12 to close the aperture 121. A processing container is constructed by closing the aperture 121 of the processing chamber 12 by the lid member 13. By doing so, a processing to the substrate S under a high pressure in the internal processing space SP is allowed. A flat plate-like support tray 15 is attached in a horizontal posture to a (+Y) side surface of the lid member 13. An upper surface of the support tray 15 serves as a support surface on which the substrate S can be placed.

The lid member 13 is supported by a support part 14 with an arm member 161 interposed therebetween, being horizontally movable in a Y direction. More specifically, the lid member 13 is attached to the arm member 161 serving as part of a later-described lock mechanism 16 and the arm member 161 is supported by the support part 14. The support part 14 includes a guide rail 141 provided on a floor of the clean room 100 along the Y direction and a slider 142 engaged with the guide rail 141 movably in the Y direction. The slider 142 is provided with supporting legs 143, and the arm member 161 is supported by the supporting legs 143.

In FIG. 2, for clearly showing the structure of the arm member 161, a movable range of the arm member 161 is largely extended in the (−Y) direction as compared with an actual range. Further, though only the support part 14 provided in a (+X) side end portion of the arm member 161 is shown in FIG. 2, the support part 14 having the same structure is also provided in a (−X) side end portion of the arm member 161. Moreover, in FIG. 2, the supporting legs 11 of the processing chamber 12 are omitted.

The lid member 13 is movable toward and away from the processing chamber 12 by an advancing/retreating mechanism 53 provided in the supply unit 50. Specifically, the advancing/retreating mechanism 53 includes a linear motion mechanism such as a linear motor, a linear guide, a ball-screw mechanism, a solenoid, an air cylinder, or the like. Such a linear motion mechanism moves the slider 142 of the support part 14 along the guide rail 141 in the Y direction, to thereby cause the lid member 13 to move in the Y direction. The advancing/retreating mechanism 53 operates in response to a control command from the control unit 90.

By a movement of the lid member 13 in a (−Y) direction, as indicated by a dotted line in FIG. 1, the support tray 15 is pulled out from the processing space SP to the outside via the aperture 121. By doing so, the support tray 15 is accessible from the outside. Specifically, it becomes possible to place the substrate S on the support tray 15 and take out the substrate S placed on the support tray 15. On the other hand, the lid member 13 moves in a (+Y) direction as indicated by the solid line in FIG. 1, whereby the support tray 15 is accommodated into the processing space SP. If the substrate S is placed on the support tray 15, the substrate S is carried into the processing space SP together with the support tray 15.

The lid member 13 moves in the (+Y) direction to close the aperture 121, whereby the processing space SP is sealed. A sealing member 122 is provided between the (+Y) side surface of the lid member 13 and the (−Y) side surface of the processing chamber 12 and an airtight state of the processing space SP is maintained. Further, the lid member 13 is fixed to the processing chamber 12 by a lock mechanism described later. The substrate S is processed in the processing space SP with the airtight state of the processing space SP ensured in this way.

The transfer unit 30 cooperates with a not-shown external conveyor robot to place the unprocessed substrate S on the upper surface of the support tray 15 and unload the processed substrate S from the support tray 15. Specifically, the transfer unit 30 includes a base part 31 supported in an up-and-down movable manner by an elevating mechanism 54 provided in the supply unit 50 and a plurality of lift pins 32 standing upward from the base part 31.

When the elevating mechanism 54 operates to move the base part 31 up and down, the lift pins 32 moves up and down integrally with the base part 31. If the base member 31 moves up to the highest position, the upper ends of the lift pins 32 reach positions above the upper surface of the support tray 15. When the lift pins 32 move up in the state that the support tray 15 is pulled out to the (−Y) direction, the upper ends of the lift pins 32 become to protrude from the upper surface of the support tray 15.

In this state, the external conveyor robot loads the unprocessed substrate S through the aperture 111 and passes the substrate S to the lift pins 32. When the lift pins 32 move down, the substrate S is passed from the lift pins 32 to the support tray 15. The substrate S can be thereby placed on the support tray 15. When the lid member 13 moves in the (+Y) direction, the support tray 15 supporting the substrate S is accommodated into the processing chamber 12.

An operation of unloading the processed substrate S is reverse to the above-described operation. Specifically, by the lid member 13 moving to the (−Y) direction, the substrate S processed in the processing chamber 12 is pulled out from the processing chamber 12 while supporting by the support tray 15. The substrate S is lifted up from the support tray 15 by the lift pins 32 moving up. In this state, the conveyer robot entered via the aperture 111 receives the substrate S from the lift pins 32 and carries out the substrate S.

In this embodiment, a fluid of a substance usable for a supercritical process, e.g. carbon dioxide, is supplied from a fluid supplier 57 provided in the supply unit 50 to the processing unit 10 in a gaseous or liquid state. Carbon dioxide is a chemical substance suitable for the supercritical drying process in having properties of entering a supercritical state at relatively low temperature and low pressure and dissolving an organic solvent often used in substrate processing well.

The fluid is filled into the processing space SP, and when the temperature and the pressure in the processing space SP reach appropriate temperature and pressure, the fluid is brought into a supercritical state. Thus, the substrate S is processed by the supercritical fluid inside the processing chamber 12. The supply unit 50 is provided with a fluid collector 55, and the fluid after having been used for the process is collected into the fluid collector 55. The fluid supplier 57 and the fluid collector 55 are controlled by the control unit 90.

In the substrate processing system 1 having the above-described main constituent elements, a supercritical drying process in which the substrate S having been transferred in a wet state with a processing liquid is dried by using the supercritical fluid is performed. In this process, the substrate S is dried by replacing the processing liquid deposited to the substrate S by the supercritical fluid having an extremely low surface tension and further directly sublimating the supercritical fluid not through a liquid phase. For this reason, particularly in drying the substrate S having a fine pattern formed on its surface, it is possible to prevent pattern collapse caused by an action of the surface tension of the liquid in a gas-liquid interface. Since such a supercritical drying process is well known, description on details of the process will be omitted herein.

During the process, the pressure in the processing space SP inside the processing chamber 12 becomes high. For this reason, in order to prevent leakage of a high-pressure fluid, appropriately maintain the pressure of the inside, and further prevent fall-off of the lid member 13 due to the inside pressure, a lock mechanism for firmly connecting the processing chamber 12 and the lid member 13 is needed. Hereinafter, with reference to FIG. 2, a structure of the lock mechanism 16 in the present embodiment will be described.

As shown in FIG. 2, the lock mechanism 16 in this embodiment includes an arm member 161 and a lock member 162. The arm member 161 is a metal member having a rough U-shape. As shown in FIG. 2, the arm member 161 has a pair of arms 161a and 161b extending in the Y direction and a connecting portion 161c extending in the X direction so as to connect respective (−Y) side end portions of these arms. The connecting portion 161c has a length larger than that of the lid member 13 in the X direction, and the lid member 13 is fixed to a (+Y) side surface thereof. In other words, the arm member 161 and the lid member 13 are mechanically integrated.

The arms 161a and 161b extend in the (+Y) direction from the connecting portion 161c, outside the lid member 13 in the X direction. In the vicinity of respective tips of the arms 161a and 161b, provided are notch parts 161d and 161e formed by partially cutting out respective arm upper end portions. Note that, as described earlier, the positional relation between the processing chamber 12 and the arm member 161 shown in FIG. 2 is different from that in an actual operating condition. The arm member 161 is pulled out toward the (−Y) direction as compared with an actual case.

The structure in which the lid member 13 and the arm member 161 are integrated as described above is combined with the processing chamber 12. The structure is movable in the Y direction by an action of the advancing/retreating mechanism 53. When the structure advances toward the (+Y) direction, the support tray 15 attached to the lid member 13 and the substrate S placed on the upper surface thereof enter the processing space SP inside the processing chamber 12 though the aperture 121 provided in the (−Y) side surface of the processing chamber 12. Finally, the structure advances to a position at which the lid member 13 comes into contact with the sealing member 122 provided around the aperture 121 to thereby close the aperture 121. By doing so, the support tray 15 and the substrate S are sealed in the processing space SP.

On the other hand, both the arms 161a and 161b of the arm member 161 advance toward the (+Y) direction through the outside of both side surfaces of the processing chamber 12 on the X direction side. An upper portion of the processing chamber 12 is cut out near the (+Y) side end portion thereof and the lock member 162 is disposed above the notch part 123. Though not described, the lock member 162 is supported in an up-and-down movable manner by an elevating mechanism such as a linear motor, a linear guide, a ball-screw mechanism, a solenoid, an air cylinder, or the like.

The lock member 162 is a rod-like member made of a metal, extending in the X direction. A cross section thereof has such a shape as to be fit in the respective notch parts 161d and 161e of the arms 161a and 161b. When the lid member 13 advances to such a position as to close the aperture 121, the respective notch parts 161d and 161e of the arms 161a and 161b advance to a position immediately below the lock member 162. In other words, so as to satisfy such a positional relation, an arrangement of the lock member 162 is determined, corresponding to the length of the arms 161a and 161b and the respective positions of the notch parts 161d and 161e.

When the lock member 162 moves down in this state, both ends of the lock member 162 in the X direction are engaged with the notch parts 161d and 161e, respectively. As a result, a rectangular annular structure consisting of the arm member 161 and the lock member 162 gets to be so disposed as to surround an entire outer periphery of the processing chamber 12.

The lock member 162 is engaged with a side surface of the notch part 123 of the processing chamber 12, and a displacement thereof toward the (−Y) direction is thereby restricted. Therefore, a displacement of the arm member 161 and the lid member 13 attached thereto in the (−Y) direction is restricted. Thus, since the lid member 13 is sandwiched between the processing chamber 12 and the lock mechanism 16 and the displacement of the lock mechanism 16 is restricted by the lock member 162, a state where the lid member 13 closes the aperture 121 is maintained. Thus, the arm member 161 and the lock member 162 serve as the lock mechanism 16 for firmly fixing the lid member 13.

This lock state is realized by mechanical engagement of the members and not realized by an active mechanism such as a motor, an air cylinder, a clutch, or the like. Therefore, no power is needed to maintain the lock state. Further, a force to push out the lid member 13 by the inside pressure of the processing space SP acts on a direction for strengthening the engagement between the arm member 161 and the lock member 162. In this meaning, the lock mechanism 16 in the present embodiment has an interlock function that functions only in a state where the internal space is sealed and can maintain the lock state not by depending on any driving force as long as the member is not mechanically broken.

This lock mechanism 16 is based on the same technical idea as that of the lock mechanism disclosed in above-described PTL 1. As described in PTL 1, in the lock mechanism 16, both in the states where the support tray 15 is accommodated in the processing space SP and where the support tray 15 is pulled out, the respective notch parts 161d and 161e of the arms 161a and 161b are positioned on the (+Y) direction side of the processing chamber 12 relative to the aperture 121. Therefore, the problem that dust which can be generated in the vicinity of the notch parts 161d and 161e by slide-rubbing with the lock member 162 is adhered on the substrate S being loaded or unloaded and the possibility that the dust may enter the processing space SP through the aperture 121 are reduced.

As shown in FIG. 1, in this embodiment, an FFU 40 for generating a downflow is provided above the support tray 15 pulled out from the processing space SP. It is thereby possible to further reduce mixing-in of contaminants due to such dust generation. Specifically, the floats due to the dust generation are carried toward the downstream side by the downflow and discharged to the outside from the exhaust port 102. For this reason, there is few possibility that contaminants may go around to the periphery of the aperture 121.

As shown in FIGS. 1 and 2, further in this embodiment, a regulator 17 is so disposed as to sandwich the processing chamber 12 from above and below. For convenience of illustration, only a rough outer shape of the regulating part 17 is indicated by a broken line in FIG. 2.

The regulator 17 includes an upper regulating plate 171 which is so formed in an L-shaped cross section as to face an upper surface and the (+Y) side surface of the processing chamber 12 and a lower regulating plate 172 which is so formed in a flat plate-like shape as to face a lower surface of the processing chamber 12. The upper surface of the processing chamber 12 and a lower surface of a horizontal part 171*a* of the upper regulating plate 171 are substantially parallel to each other and the lower surface of the processing chamber 12 and an upper surface of the lower regulating plate 172 are substantially parallel to each other. Further, the (+Y) side surface of the processing chamber 12 and a vertical part 171*b* of the upper regulating plate 171 are substantially parallel to each other.

A lower end of the vertical part 171*b* of the upper regulating plate 171 and a (+Y) side end portion of the lower regulating plate 172 are not connected to each other but isolated from each other with a certain interval therebetween. For this reason, a slit-like aperture having a certain width and extending along the X direction is formed therebetween.

Note that, similarly with respect to both side surfaces of the processing chamber 12 on the (+X) and (−X) sides, regulating plates facing these surfaces may be provided, and in this case, the regulator 17 is so constructed in a box shape as to surround the surfaces among the periphery of the processing chamber 12, except the (−Y) side surface provided with the aperture 121.

Figure 3B:
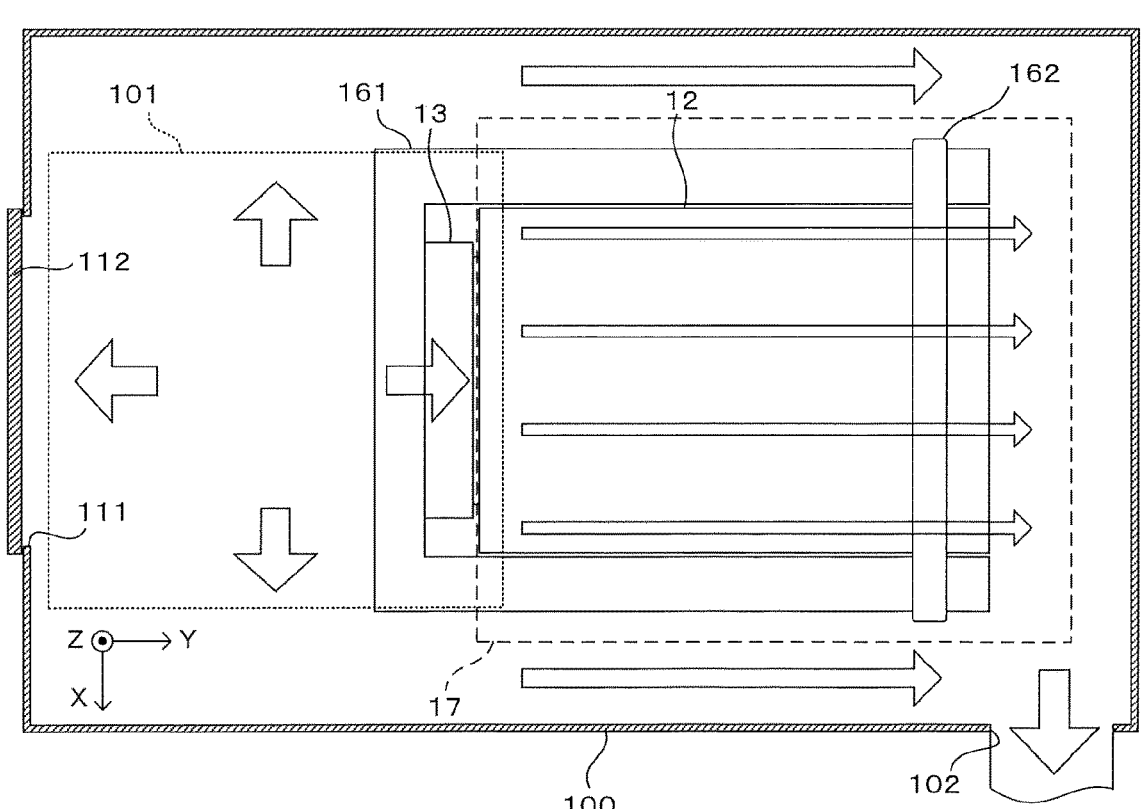

FIGS. 3A and 3B are views used for explaining an action of the regulator. In more detail, FIG. 3A is a side sectional view showing a state where the support tray 15 is accommodated in the processing space SP, and FIG. 3B is a plan view thereof. In these figures, a blank (open) arrow schematically shows an airflow and the thickness thereof indicates a magnitude of the flow velocity. Specifically, a thick arrow schematically shows an airflow having a high flow velocity and a thin arrow schematically shows an airflow having a low flow velocity. The length of the arrow has no quantitative meaning.

As shown in FIG. 3A, a downflow having a relatively high flow velocity is sent out from the FFU 40 attached to the inlet port 101 provided in an upper portion of the clean room 100. This downflow mainly blows out toward a space into which the support tray 15 is pulled out. For this reason, the dust or the like generated in loading or unloading of the substrate S is carried downward and finally discharged to the outside, and adhesion of the dust onto the substrate S and entry thereof into the processing space SP are thereby suppressed.

As shown in FIG. 3B, in a plan view, the processing unit 10 is disposed between passages of the airflows reaching from the inlet port 101 to the exhaust port 102. Therefore, the air introduced to the clean room 100 as the downflow necessarily passes through around the processing unit 10 to flow into the exhaust port 102. In other words, an airflow caused by the downflow is generated around the processing chamber 12.

In a case where the regulator 17 is not provided to expose the processing chamber 12, part of the downflow directly blows onto the upper surface of the processing chamber 12. Further, the airflow advances above and below the processing chamber 12 and is finally discharged from the exhaust port 102. At that time, the flow velocity and the flow quantity of the airflow on outer surfaces of the processing chamber 12 depend on the arrangement of the processing chamber 12 in the clean room 100, more specifically, the positional relation between the FFU 40 and the exhaust port 102 are not always the same.

For this reason, cooling effects in the processing chamber 12 by the airflow are different among the surfaces, and this becomes a cause of the temperature irregularity. In a supercritical processing apparatus, for example, a processing fluid having a temperature (e.g., about 80° C.) higher than the temperature in the conventional case (e.g., about 40° C.) is sometimes used so as to increase the operation efficiency. In this case, the processing fluid is supplied from the fluid supplier 57 to the processing space SP in a preheated state.

In such a case, the temperature irregularity in the processing chamber 12 affects the processing quality. More specifically, the density of the fluid in a supercritical processing state is sensitive to the temperature and a large density change can be caused by a slight temperature change. In a process for replacing a liquid adhered on a substrate by a processing fluid, for example, such a density change causes a variation in the amount of liquid which can be taken into the processing fluid and as a result, causes a large variation in the replacement efficiency.

Then, in this embodiment, the periphery of the processing chamber 12, specifically in this case, the upper surface, the lower surface, and the (+Y) side surface thereof are covered with the regulator 17. The airflow flowing along the surfaces of the processing chamber 12 is controlled, to thereby suppress occurrence of temperature irregularity. Specifically, first, by regulating the passage of the airflow flowing along the surfaces of the processing chamber 12 by the regulator 17, it is possible to suppress a variation depending on the apparatus layout and stabilize a contact state between the airflow and the processing chamber 12.

In this embodiment, by forming a passage sandwiched between the upper surface of the processing chamber 12 and the upper regulating plate 171 on the upper surface side of the processing chamber 12 and a passage sandwiched between the lower surface of the processing chamber 12 and the lower regulating plate 172 on the lower surface side of the processing chamber 12, an airflow stably flowing in the horizontal direction along the upper surface and the lower surface of the processing chamber 12 can be generated. The direction of the airflow is the (+Y) direction, and the dust or the like generated around the processing chamber 12 is carried in a direction going away from the aperture 121. It is thereby possible to suppress extraneous matters from entering the processing space SP.

When the flow velocity of the airflow flowing along the surfaces of the processing chamber 12 is made lower than the flow velocity of the downflow, the cooling effect of the processing chamber 12 by the downflow can be reduced. By reducing the width of the passage, the flow velocity can be suppressed. Further, when the surface of the processing chamber 12 and the surface of the regulator 17 which face each other are made parallel to each other, as shown in FIG. 3B, it is possible to uniformize the flow velocity regardless of the position. Furthermore, when the respective flow velocities of the airflows flowing along the surfaces are made almost equal to one another, it can make the cooling effects on the surfaces almost the same. It is possible to reduce the temperature irregularity in the processing chamber 12.

For example, the pressure loss in the passage of the airflow which is surrounded by the surface of the processing chamber 12 and the regulator 17 may be made equal among on the upper surface side and on the lower surface side (further on the X direction side surface sides). By doing so, the flow velocities of the airflows flowing along these surfaces can be made almost equal to one another. As a simple method, when the distance between the upper surface of the processing chamber 12 and the upper regulating plate 171 and the distance between the lower surface of the processing chamber 12 and the lower regulating plate 172 are made equal to each other, almost the same flow velocities can be obtained on the upper surface side and on the lower surface side of the processing chamber 12.

Note that there is a possibility that an effective airflow cannot be formed when this distance is too small. From the knowledge of the inventor of the present application, it is preferable that the distance between the processing chamber 12 and the regulator 17 should be 10 mm or more. Furthermore, in order to avoid the downflow sent out from the inlet port 101 from coming into direct contact with the processing chamber 12, it is preferable that the upper regulating plate 171 should have such a shape and an arrangement in a plan view as to cover the processing chamber 12 at least in the vicinity of the (−Y) side end portion of the processing chamber 12.

In a case where it is hard to uniformize the flow velocity in these constituent elements depending on the apparatus layout, by adjusting the shape of the regulator 17 and the distance between the surfaces of the processing chamber 12 and the regulator 17 as appropriate, it is possible to uniformize the flow velocity. Since it is thought that the airflow has reproducibility as long as a stable downflow is supplied, optimization can be performed by performing experiments in advance.

Further, as necessary, an additional regulating member may be provided in part of the passage. In a case where the flow velocity along the surface of the processing chamber 12 is too high, for example, the flow velocity can be reduced by disposing a perforated plate at some midpoint of the passage. Furthermore, for example, a regulating plate for controlling the direction of the airflow may be further provided.

The airflow flowing along the surface of the processing chamber 12 flows into the exhaust port 102 through a slit between the upper regulating plate 171 and the lower regulating plate 172. Since the air is discharged through a passage which is narrowed into such a slit shape, it becomes easier to control the flow velocity. Further, the effect produced on the airflow by the positional relation between the processing chamber 12 and the exhaust port 102 can be reduced. In other words, it can be said that there is a high degree of freedom in the position setting of the exhaust port 102. A member for adjusting the pressure loss may be additionally provided in at least one of the slit-like aperture and the exhaust port 102.

As described above, in this embodiment, the regulator 17 for generating an airflow flowing along the surface of the processing chamber 12 from the downflow is constructed as a plate-like cover which is so formed as to surround the processing chamber 12. With such a configuration, the airflow can be stabilized by regulating the passage of the airflow flowing along the processing chamber 12 and the flow velocity of the airflow can be suppressed by forming a passage having a relatively narrow width. It is thereby possible to suppress the temperature decrease in the processing chamber 12.

The effect of suppressing the temperature decrease herein includes both an effect of suppressing the magnitude of the temperature decrease itself and an effect of giving excellent reproducibility to the temperature decrease caused by the airflow. With these effects, it is possible to suppress a variation in the processing quality which is caused by the temperature irregularity and perform satisfactory and stable processing on the substrate S.

FIG. 4 is a view showing a schematic configuration of the second embodiment of a substrate processing system including a substrate processing apparatus according to the present invention. Note that, also in a substrate processing system 1A of this embodiment, the main constituent elements are common to those in the substrate processing system 1 of the first embodiment. Then, the constituent elements common to those in the first embodiment are represented by the same reference signs, and description on the configuration and the function thereof will be omitted unless particularly necessary.

The configuration and the operation of the processing unit 10 in this embodiment are basically the same as those in the first embodiment. Instead of the cover-like regulator 17 which covers the periphery of the processing chamber 12 in the first embodiment, however, a regulator in this embodiment is constructed as a barrier wall (bulkhead) for dividing the internal space of the clean room 100 into two spaces. In other words, the regulator in this embodiment has a vertical barrier wall 18 which is parallel to the XZ plane.

The barrier wall 18 divides the internal space of the clean room 100 into a first space S1 including the inlet port 101 and the processing unit 10 and a second space S2 not including these elements but including the exhaust port 102. The barrier wall 18 is provided with a plurality of through holes 181, and the first space S1 and the second space S2 communicate with each other through these through holes 181.

Therefore, the downflow supplied from the FFU 40 to the first space S1 through the inlet port 101 finally becomes an airflow in the horizontal direction, which flows into the second space S2 through the through holes 181. In other words, the barrier wall 18 has a function of changing the downflow to the airflow in the horizontal direction. The gases passing through the through holes 181 are joined in the second space S2, to be discharged to the outside through the exhaust port 102. From this, it can be said that the second space S2 as viewed from the first space S1 functions as a kind of exhaust duct for drawing in and discharging the atmosphere inside the first space S1.

Thus, since the barrier wall 18 has a function of converting the downflow into a horizontal airflow, the airflow flowing in the horizontal direction is also formed around the processing chamber 12. The direction of the airflow flowing along the surface of the processing chamber 12 is thereby stabilized. On the other words, it is possible to control the flow velocity thereof with the aperture size, the shape, the arrangement, the density, or the like of each through hole 181.

FIGS. 5A and 5B are views showing an exemplary arrangement pattern of the through holes in the barrier wall. As described earlier, it is preferable that an airflow having a flow velocity lower than that of the downflow should be formed around the processing chamber 12. In order to realize this, for example, in an elevational view of the barrier wall 18 in the (+Y) direction, a passage resistance can increase in any one through hole in the vicinity of the processing chamber 12 and a passage resistance can decrease in any one through hole at a position away from the processing chamber 12. It is thereby possible to control the airflow so that the flow velocity may be relatively low in the vicinity of the processing chamber 12 and the flow velocity may be relatively high at a position further away from the processing chamber 12.

As shown in FIG. 5A, for example, through holes 181_a_ each having a relatively small diameter can be disposed in the vicinity of the processing chamber 12 and through holes 181_b_ each having a larger diameter can be disposed at a position away from the processing chamber 12. Further, through holes each having a middle size may be disposed as appropriate. Furthermore, as shown in FIG. 5B, the through hole may be a long hole, and in this case, through holes 181_c_ each having a relatively small area may be disposed in the vicinity of the processing chamber 12 and through holes 181_d_ each having a larger area may be disposed at a position away from the processing chamber 12. In terms of making the passage resistance different among the through holes, it is preferable to make the length in a short axis direction different, not the length in a long axis direction of the long hole.

Further, as shown in FIGS. 5A and 5B, a relatively large aperture 182 corresponding to the size of the processing chamber 12 may be provided in a center portion of the barrier wall 18, specifically in a portion in which the processing chamber 12 is projected as viewed in the Y direction. By doing this, it is possible to guide the airflow flowing along the surface of the processing chamber 12 smoothly to the second space S2. This is effective in improving uniformity of the flow velocity of the airflow around the processing chamber 12.

Further, as shown in FIG. 3B, the processing unit 10, particularly the processing chamber 12, can have a symmetric structure with respect to the YZ plane in a plan view. Then, the processing unit 10 is disposed at the center in the X direction, like in FIG. 3B, and the through holes 181 are arranged symmetrically with respect to the YZ plane as shown in FIGS. 5A and 5B in the clean room 100. It becomes possible to naturally keep a flow balance between the airflow flowing on the (+X) side surface of the processing chamber 12 and the airflow flowing on the (−X) side surface of the processing chamber 12. It is thereby possible to eliminate the temperature difference between the (+X) side surface of the processing chamber 12 and the (−X) side surface of the processing chamber 12.

Such a balance is hard to keep in the configuration where the air is discharged from the internal space of the clean room 100 directly to the exhaust port 102. However, in this embodiment, it becomes easy to keep the flow balance in the X direction by providing the barrier wall 18 to control the flow quantity. Further, in a case where the flow balance cannot be kept with the (−X) side since the exhaust port 102 is disposed one-sidedly on the (+X) side, the through holes may be arranged asymmetrically in order to solve this problem.

Further, also in this embodiment, an additional regulating member may be provided so as to more accurately control the airflow along the surface of the processing chamber 12. Such a regulating member may be provided in the first space S1 or may be provided in the second space S2. Furthermore, for example, combination of the regulation by the regulating plate shown in the first embodiment and that by the barrier wall shown in the second embodiment may be performed.

As described above, in the above-described embodiment, the processing unit 10, the supply unit 50, and the control unit 90 integrally function as a "substrate processing apparatus" of the present invention. Then, the clean room 100 corresponds to a "processing room" of the present invention, and the substrate processing system 1 or 1A in which the FFU 40 and the like serving as an "airflow generator" and an "airflow generation apparatus" are added to these constituent elements functions as a "substrate processing system" of the present invention.

Note that the present invention is not limited to the above-described embodiments, and various changes other than the aforementioned ones can be made without departing from the gist of the present invention. For example, in the above-described embodiments, the configuration of the regulator 17 or 18, particularly the arrangement and the size thereof, is set in advance on the basis of a predetermined rule or experimentally. However, Adjustment not in advance may be performed, for example, by making the position of the regulating part adjustable or making the aperture size of each through hole or the number of through holes changeable.

Furthermore, in the substrate processing systems 1 and 1A of the above-described embodiments, for example, the flat plate-like support tray 15 on which the substrate S is placed is accommodated into the processing chamber 12 and passing of the substrate to/from an external apparatus is performed through the lift pins 32. However, the manners of supporting the substrate S and passing the substrate to/from the outside are not limited to this exemplary case.

Further, for example, the processing unit 10 of the above-described embodiment includes the lock mechanism 16 for locking the processing chamber 12 by using the pair of arms 161_a_ and 161_b_ extending in the Y direction. However, any type of mechanism can be applied as the lock mechanism and the lock mechanism is not limited to the structure disclosed herein.

Furthermore, in the above-described embodiment, the lid member 13 and the arm member 161 integrally advance and retract relatively to the fixed processing chamber 12. However, the processing chamber with the lid member fixed thereon may move, to thereby achieve a relative movement of these elements. In general, however, from the points that the processing chamber is larger and heavier than the lid member, that various pipes are connected to the processing chamber, and the like, it is thought to be practical to fix the processing chamber and move the lid member.

Further, the above-described embodiment is the substrate processing system for processing the substrate by using the supercritical fluid. However, the present invention is not limited to this exemplary case and the present invention can be applied to various processings performed on the substrate inside the processing chamber by using a heated processing fluid.

Thus, as the specific embodiments have been illustrated above, in the substrate processing apparatus and the substrate processing system according to the present invention, it is preferable that the flow velocity of the airflow around the processing chamber should be lower than that of the downflow. Further, the direction of the airflow may be the horizontal direction. As the flow velocity of the airflow increases, the cooling effect on the processing chamber becomes larger. In order to achieve a uniform cooling effect, it is desirable that an airflow having a flow velocity lower than that of the downflow should be generated.

Further, for example, the regulator may be configured to have a regulating plate disposed in parallel to each of at least the upper surface and the lower surface among the surfaces of the processing chamber. With such a configuration, the airflows having a uniform flow velocity can be formed in a gap between the surface of the processing chamber and the regulating plate. As a result, it is possible to uniformize the cooling effects by the airflows and suppress occurrence of the temperature irregularity.

In this case, there may be a configuration where the distance between the upper surface and the regulating plate facing the upper surface is equal to that between the lower surface and the regulating plate facing the lower surface. With such a configuration, the pressure loss is equal between the passage formed on the upper surface side of the processing chamber and that formed on the lower surface side of the processing chamber. Therefore, the flow velocities of the airflows flowing in these passages can be made equal to one another.

Further, for example, the fluid supplier may be configured to fill the processing space with the processing fluid in the supercritical state. There are various techniques for processing a substrate inside the processing chamber by using the heated processing fluid, and in particular, the present invention is suitably applied to the processing using the supercritical processing fluid. This is because the supercritical processing fluid has a property in which the density is largely changed by a slight temperature change, and it is a key to stabilize the temperature of the fluid so as to achieve stable processing.

Furthermore, in the substrate processing system according to the present invention, for example, there may be a configuration where the regulator has a vertical barrier wall for dividing the internal space into the first space which includes the processing chamber and the lid part and communicates with the inlet port and the second space which does not include the processing chamber or the lid part and communicates with the exhaust port and the barrier wall is provided with the plurality of through holes for sending the airflow therethrough. With such a configuration, when the air supplied to the first space in the processing room as the downflow passes through the through hole of the barrier wall and moves to the second space, a flowing direction of the airflow is changed to the horizontal direction. Then, since the airflow around the processing chamber can be controlled by the arrangement of the through holes, it is possible to suitably achieve airflow control in the present invention.

Further, for example, the processing chamber may be disposed between the inlet port and the exhaust port in a plan view. With such a configuration, since the airflow going from the inlet port toward the exhaust port naturally passes through around the processing chamber, it is not necessary to generate a new airflow and only necessary to simply control the flow thereof.

This invention can be applied in general to a substrate processing apparatus for processing a substrate inside a processing chamber by using a heated processing fluid. Particularly, this invention can be suitably applied to a substrate drying processing for drying a substrate such as a semiconductor substrate or the like with a supercritical fluid.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus provided in a clean room where a downflow is generated by a fan filter unit provided to a ceiling of the clean room, the substrate processing apparatus comprising:
   a processing chamber which is disposed in an downflow environment below the fan filter unit in the clean room, the processing chamber having a processing space capable of accommodating a substrate inside and being provided with an aperture on one side surface thereof, which communicates with the processing space to cause the substrate to pass therethrough;
   a lid part which closes and opens the aperture;
   a fluid supplier which supplies a heated processing fluid to be used for processing the substrate to the processing space closed by the lid part;
   an upper regulating plate which is disposed below the fan filter unit and includes a horizontal part and a vertical part, the horizontal part extending in a first direction, which is a horizontal direction from the one side surface to an other side surface of the processing chamber opposite to the one side surface, with a certain interval from an upper surface of the processing chamber, the vertical part extending downwardly from an end of the horizontal part in the first direction with a certain interval from the other side surface of the processing chamber;
   a lower regulating plate which is disposed between a floor of the clean room and a lower surface of the processing chamber with a certain interval from the lower surface of the processing chamber and extends along the first direction, wherein:
   the horizontal part and an upper end of the one side surface form an aperture extending along a second direction which is a horizontal direction perpendicular to the first direction;
   the lower regulating plate and a lower end of the one side surface form an aperture extending along the second direction; and
   the lower regulating plate and a lower end of the vertical part form an aperture having a slit-like shape and extending along the second direction.

2. The substrate processing apparatus according to claim 1, wherein a flow velocity of an airflow around the processing chamber is lower than a velocity of the downflow.

3. The substrate processing apparatus according to claim 1, wherein a direction of an airflow along the upper surface of the processing chamber is a horizontal direction.

4. The substrate processing apparatus according to claim 1, wherein the upper regulating plate is parallel to the upper surface and the lower regulating plate is parallel to the lower surface.

5. The substrate processing apparatus according to claim 4, wherein a distance between the upper surface and the upper regulating plate is equal to that between the lower surface and the lower regulating plate.

6. The substrate processing apparatus according to claim 1, wherein the fluid supplier fills the processing space with the processing fluid in a supercritical state.

7. A substrate processing system, comprising:
   a processing chamber having a processing space capable of accommodating a substrate inside, being provided with an aperture on a side surface thereof, which communicates with the processing space to cause the substrate to pass therethrough, and being disposed under a downflow environment;
   a lid part which closes and opens the aperture;

a fluid supplier which supplies a heated processing fluid to be used for processing the substrate to the processing space closed by the lid part;

a processing room accommodating the processing chamber and the lid part integrally in an internal space thereof;

an airflow generator which generates a downflow in the internal space from an inlet port provided above the processing chamber among wall surfaces of the processing room;

an exhaust port which is provided below the processing chamber among the wall surfaces of the processing room and exhausts the internal space; and a regulator which guides at least part of an air flowing as the downflow to around the processing chamber and generates an airflow having a uniform flow velocity along an outer surface of the processing chamber; wherein the regulator includes a vertical barrier wall which divides the internal space into a first space and a second space, the first space including the processing chamber and the lid part and communicating with the inlet port, and the second space not including the processing chamber or the lid part and communicating with the exhaust port, and the barrier wall is provided with a plurality of through holes for passing the airflow therethrough.

8. The substrate processing system according to claim 7, wherein the processing chamber is disposed between the inlet port and the exhaust port in a plan view.

* * * * *